US006948147B1

(12) United States Patent
New et al.

(10) Patent No.: US 6,948,147 B1
(45) Date of Patent: Sep. 20, 2005

(54) METHOD AND APPARATUS FOR CONFIGURING A PROGRAMMABLE LOGIC DEVICE USING A MASTER JTAG PORT

(75) Inventors: Bernard J. New, Carmel Valley, CA (US); Adam P. Donlin, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 146 days.

(21) Appl. No.: 10/407,327

(22) Filed: Apr. 3, 2003

(51) Int. Cl.[7] .............................................. G06F 17/50
(52) U.S. Cl. ......................................... 716/16; 716/17
(58) Field of Search ............. 716/16, 17; 714/726–727

(56) References Cited

U.S. PATENT DOCUMENTS

| 6,058,255 | A  | * | 5/2000  | Jordan ............................ 716/4 |
| 6,134,707 | A  | * | 10/2000 | Herrmann et al. .......... 717/139 |
| 6,243,842 | B1 | * | 6/2001  | Slezak et al. ................ 714/724 |
| 6,614,259 | B2 | * | 9/2003  | Couts-Martin et al. ....... 326/40 |
| 6,629,308 | B1 | * | 9/2003  | Baxter .......................... 716/16 |
| 6,629,311 | B1 | * | 9/2003  | Turner et al. .................. 716/17 |
| 6,681,378 | B2 | * | 1/2004  | Wang et al. ................... 716/17 |
| 6,839,873 | B1 | * | 1/2005  | Moore ......................... 714/725 |
| 2001/0056558 | A1 | * | 12/2001 | Couts-Martin et al. ...... 714/726 |
| 2002/0010903 | A1 | * | 1/2002  | Osann et al. .................. 716/18 |
| 2002/0070753 | A1 | * | 6/2002  | Vogel et al. ................... 326/37 |
| 2002/0157078 | A1 | * | 10/2002 | Wang et al. ................... 716/17 |
| 2003/0020512 | A1 | * | 1/2003  | Mantey et al. ................. 326/38 |
| 2003/0023771 | A1 | * | 1/2003  | Erickson et al. ............. 709/327 |
| 2003/0120987 | A1 | * | 6/2003  | Savaria et al. .............. 714/726 |
| 2004/0001432 | A1 | * | 1/2004  | Wescott ....................... 370/217 |
| 2004/0061147 | A1 | * | 4/2004  | Fujita et al. ................. 257/232 |
| 2004/0130944 | A1 | * | 7/2004  | Krause et al. ......... 365/185.01 |

\* cited by examiner

*Primary Examiner*—Stacy A Whitmore
*Assistant Examiner*—Magid Y Dimyan
(74) *Attorney, Agent, or Firm*—W. Eric Webostad

(57) ABSTRACT

Method and apparatus for configuring a programmable logic device using configuration data stored in an external memory is described. In an example, a boundary scan port includes a data input terminal and a data output terminal. An instruction-set processor includes a first interface coupled to the boundary scan port and a second interface coupled to a configuration memory within the programmable logic device. The data output terminal of the boundary scan port is coupled to provide instruction data to the external memory and the data input terminal is coupled to receive configuration data from the external memory in response to the instruction data. The instruction-set processor is configured to provide configuration data to the configuration memory.

33 Claims, 3 Drawing Sheets

METHOD AND APPARATUS FOR CONFIGURING A PROGRAMMABLE LOGIC DEVICE USING A MASTER JTAG PORT

FIELD OF THE INVENTION

One or more aspects of the present invention relate generally to programmable logic devices and, more particularly, to configuring programmable logic devices.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured.

It is often desirable to include a microprocessor within an FPGA. The microprocessor, sometimes referred to as an embedded core, may be capable of defining its own peripheral logic by configuring a portion of the FPGA. However, some portion of the FPGA must be configured before the embedded microprocessor can operate and, in addition, a "boot code" that is initially executed by the embedded microprocessor may need to be loaded into memory. Consequently, the FPGA is configured in two stages, one before and one after the microprocessor is booted.

Several options currently exist for this two-phase configuration. External "configurator" logic may be used to transfer initial configuration data into the FPGA from a non-volatile memory. Such configurator logic, however, typically lies idle except for a few milliseconds during FPGA power-up. A master-serial mode technique may be employed to transfer initial configuration data into the FPGA. The master serial mode technique, however, uses an FPGA-specific serial programmable read-only memory (SPROM), which is costly and not easily updated by the embedded microprocessor. A master-SelectMap mode technique is, in effect, a byte-wide master-serial mode technique and suffers from similar drawbacks. A master-parallel mode technique requires the use of a large number of pins on the FPGA package that in many instances will not be reused after the initial configuration phase.

Therefore, there exists a need in the art for a configuration technique that does not require external configuration logic or other specialized circuitry commonly associated with the forgoing configuration techniques.

SUMMARY OF THE INVENTION

Method and apparatus for configuring a programmable logic device using configuration data stored in an external memory is described. In an embodiment, a boundary scan port includes a data input terminal and a data output terminal. An instruction-set processor includes a first interface coupled to the boundary scan port and a second interface coupled to a configuration memory within the programmable logic device. The data output terminal of the boundary scan port is coupled to provide instruction data to the external memory and the data input terminal is coupled to receive configuration data from the external memory in response to the instruction data. The instruction-set processor is configured to provide configuration data to the configuration memory.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for configuring a programmable logic device using a master boundary scan port is described. One or more aspects in accordance with the invention are described in terms of a field programmable gate array (FPGA) having a master Joint Test Action Group (JTAG) port. While specific reference is made to an FPGA having a master JTAG port, those skilled in the art will appreciate that one or more aspects of the invention may be used in other types of programmable logic devices that include a master boundary scan port, such as complex programmable logic devices (CPLDs).

Figure 1:
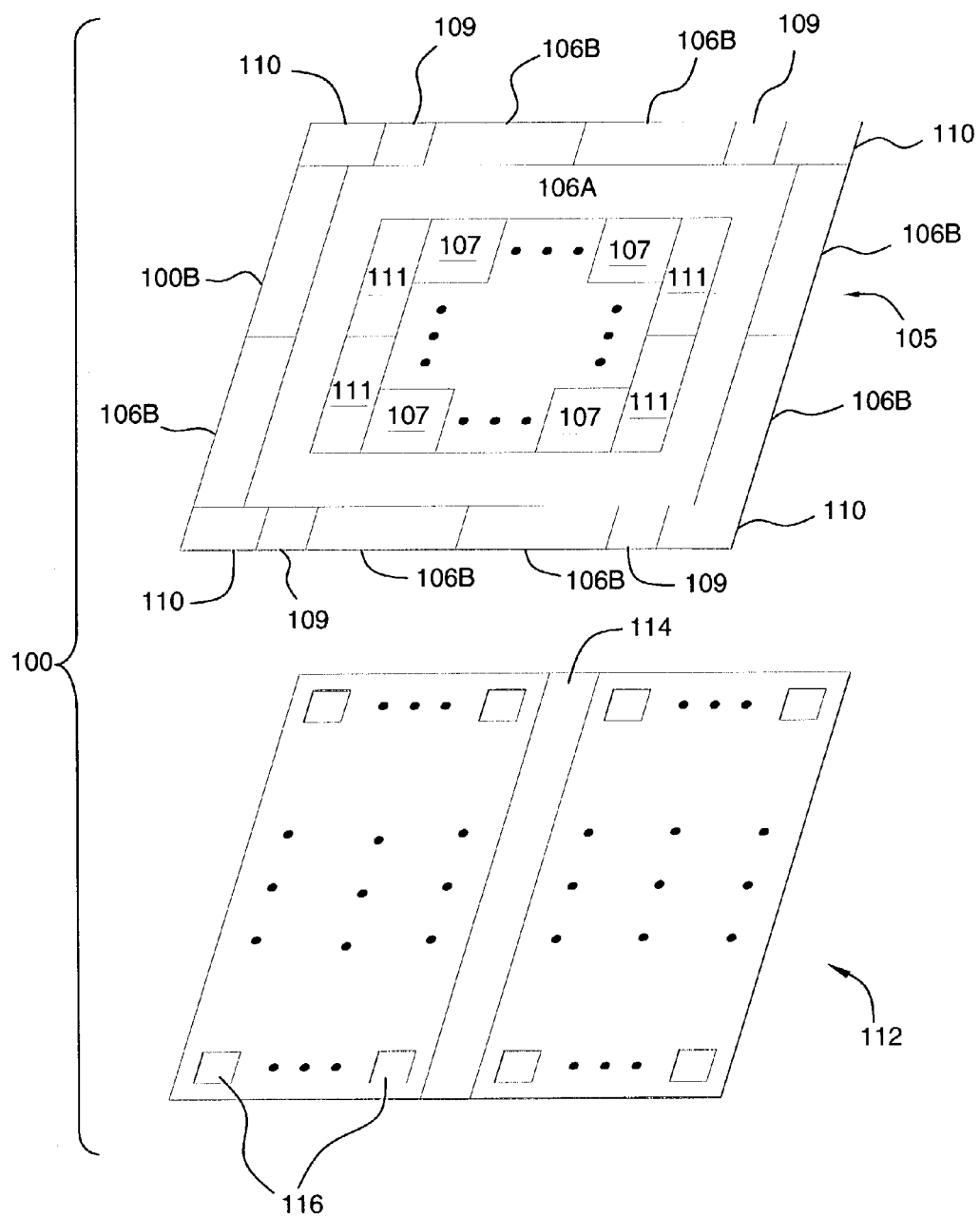
FIG. 1 depicts a split-level perspective diagram showing an exemplary embodiment of an FPGA in accordance of one or more aspects of the invention.

FIG. 1 depicts a split-level perspective diagram showing an exemplary embodiment of an FPGA 100 in accordance of one or more aspects of the invention. FPGA 100 illustratively includes a logic plane 105 and a configuration plane 112. Although FGPA 100 is described herein as having logic plane 105 and configuration plane 112 for purposes of clarity by example, those skilled in the art understand that the physical circuitry of the logic plane 105 and the configuration plane 112 is formed on one physical plane of a semiconductor substrate that is housed in a package having externally accessible pins.

Logic plane 105 illustratively includes CLBs 107, I/O routing ring 106A, memory 111, such as random access memory, delay lock loop (DLL) blocks 109, multiply/divide/de-skew clock circuits 110, and programmable IOBs 106B. DLL blocks 109 and clock circuits 110 collectively provide well-known digital clock management (DCM) circuits for managing clock signals within FPGA 100. Those skilled in the art understand that FPGA 100 may include other types of logic blocks and circuits in addition to those described herein. Configuration plane 112 illustratively includes a configuration circuitry 114 and an array of configuration memory cells 116 ("configuration memory"). Configuration memory 116 comprises random access memory, such as static random access memory (SRAM).

As is well known in the art, CLBs 107 are programmably connectable to each other, and to I/O routing ring 106A, for performing various types of logic functions. Each of CLBs 107 may include one or more "slices" and programmable interconnect circuitry (not shown). Each CLB slice in turn includes various circuits, such as flip-flops, function generators (e.g., a look-up tables (LUTs)), logic gates, and like type well-known circuits. CLBs 107 receive clock signals from clock circuits 110 in a well-known manner.

Programmable IOBs 106B are configured to provide input to, and receive output from, one or more of CLBs 107. Configuration information for CLBs 107, I/O routing ring 106A, and programmable IOBs 106B is stored in configuration memory 116. As understood by those skilled in the art, each of programmable IOBs 106B, CLBs 107, and I/O routing ring 106A may be associated with one or more of configuration memory cells 116, the contents of which determine how the programmable IOBs 106B, CLBs 107, and I/O routing ring 106A are configured. As described in more detail below, configuration information is provided to configuration memory 116 using configuration circuitry 114.

Figure 2:
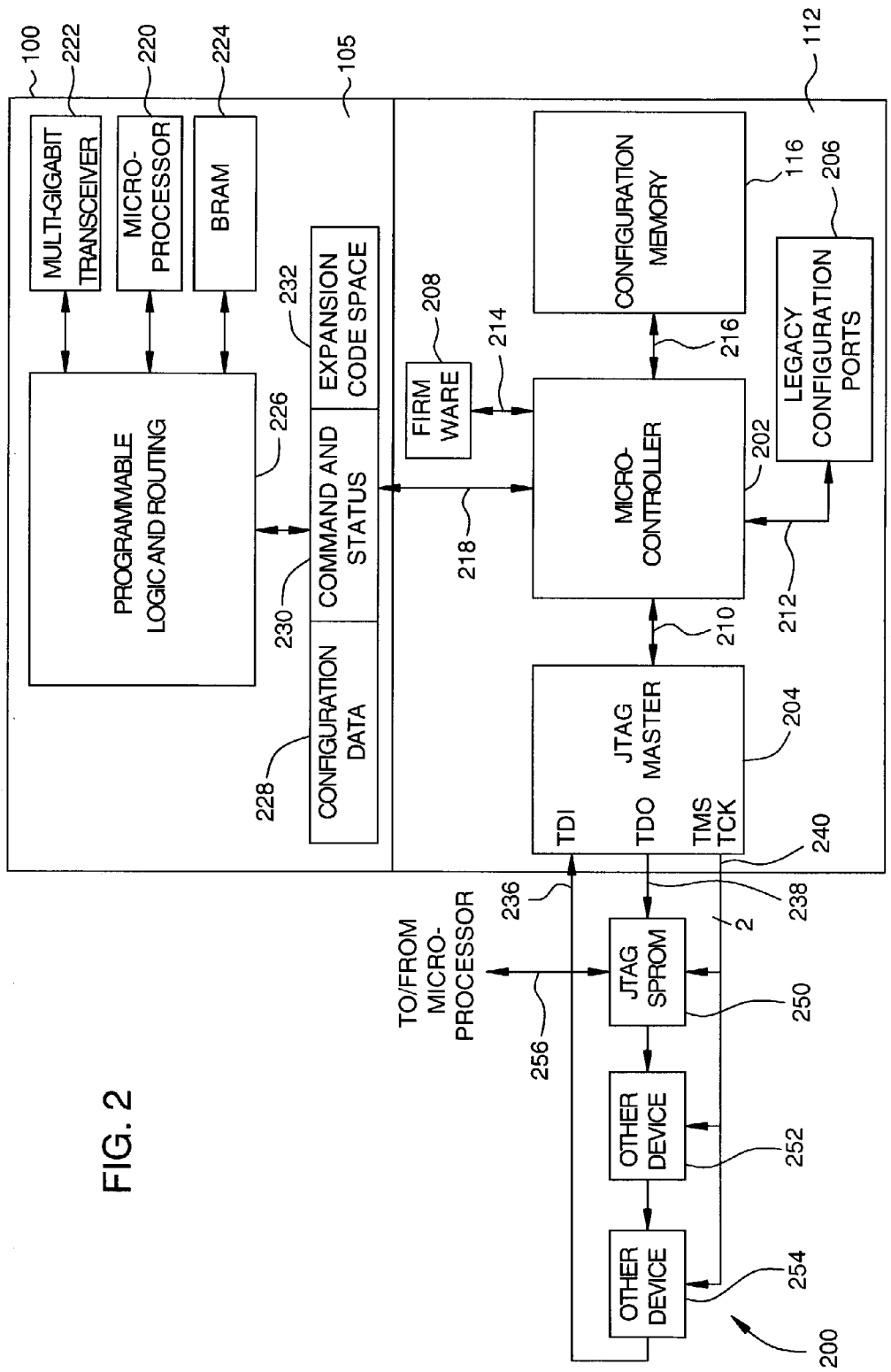
FIG. 2 depicts a block diagram showing an exemplary embodiment of an FPGA coupled to a boundary scan device chain in accordance with one or more aspects of the invention.

FIG. 2 depicts a block diagram showing an exemplary embodiment of FPGA 100 coupled to a boundary scan device chain 200 in accordance with one or more aspects of the invention. Elements that are the same or similar to those shown in FIG. 1 are designated with identical reference numerals and are described above. For purposes of clarity by example, boundary scan device chain 200 is described as a JTAG device chain as defined in the well-known IEEE standard 1149.1. JTAG device chain 200 may be disposed on a printed circuit board (PCB) with FPGA 100, or may be integrated within the same package as FPGA 100. JTAG device chain 200 includes an external memory 250 that stores configuration data for FPGA 100. External memory 250 may comprise a non-volatile memory source that complies with the above-mentioned JTAG standard. For purposes of clarity by example, external memory 250 is described as a serially programmable ROM (SPROM), although other types or ROMs may be used.

JTAG device chain 200 may also include one or more other JTAG devices that are serially coupled to SPROM 250. SPROM 250 is serially coupled to a JTAG device 252 and a JTAG device 254. In an embodiment, SPROM 250 is disposed within JTAG device chain 200 closest to FPGA 100 and is referred to as the "head" or "start" of the JTAG device chain 200. JTAG device 254 is disposed within JTAG device chain 200 farthest from FPGA 100 and is referred to as the "tail" or "end" of the JTAG device chain 200. Although SPROM 250 is described as being the head of JTAG device chain 200, those skilled in the art will appreciate that SPROM 250 may be located anywhere within JTAG device chain 200.

Configuration plane 112 includes an instruction-set processor 202, a master boundary scan port 204, legacy configuration ports 206, firmware memory 208, and configuration memory 116. In this example, master boundary scan port 204 is a master JTAG port capable of communicating with JTAG device chain 200, and instruction-set processor 202 is a micro-controller. Micro-controller 202, master JTAG port 204, legacy configuration ports 206, and firmware memory 208 comprise at least a portion of configuration circuitry 114. Micro-controller 202 includes an interface 210 coupled to master JTAG port 204, an interface 212 coupled to legacy configuration ports 206, and interface 214 coupled to firmware memory 208, an interface 216 coupled to configuration memory 116, and an interface 218 coupled to logic plane 105.

Logic plane 105 includes a microprocessor 220, a multi-gigabit transceiver (MGT) 222, block RAM (BRAM) 224, programmable logic and routing 226, a configuration data port 228, a command and status port 230, and an expansion code space port 232. Programmable logic and routing 226 includes IOBs, CLBs, and programmable interconnect as described above. For purposes of clarity, FPGA 100 may be considered as a system-on-a-chip (SoC), where microprocessor 220 is an embedded processor core within FPGA 100. Microprocessor 220 may be an IBM PowerPC®, Intel Pentium®, AMD Athlon®, or like type processor core known in the art. MGT 222 is a well-known device that may be used within FPGA 100 to communicate with external devices and systems. For example, MGT 222 may be used to communicate with the Internet. BRAM 224 comprises blocks of random access memory, such as static RAM (SRAM). Microprocessor 220, MGT 222, and BRAM 224 are coupled to programmable logic and routing 226 in a well-known manner. Configuration data port 228, command and status port 230, and expansion code space port 232 are used to provide access between logic plane 105 and configuration plane 112 and are described in more detail below.

FPGA 100 employs master JTAG port 204 to load configuration data stored within SPROM 250 into configuration memory 116. For example, SPROM 250 may store data for configuring FPGA 100 such that microprocessor 220 becomes operational ("booted") and connected to resources external to FPGA 100. After microprocessor 220 is booted, configuration of FPGA 100 may be controlled using microprocessor 220. Although some embodiments of the invention is described in the context of configuring an FPGA to boot an embedded microprocessor, those skilled in the art will appreciate that other embodiments of the invention may be used to configure an FPGA for other purposes, including loading the configuration data in its entirety.

Unlike a conventional FPGA JTAG port, master JTAG port 204 operates as a primary or "master" port, rather than a secondary or "slave" port. Primary JTAG port 204 does not use external circuitry for control when accessing SPROM 250, in contrast to a secondary JTAG port. Thus, master JTAG port 204 advantageously obviates the need to provide external configuration logic to configure FPGA 100. Furthermore, master JTAG port 204 may be used to provide a mechanism through which microprocessor 220 can perform system diagnostics.

Master JTAG port 204 includes four terminal types, namely, a test data input (TDI) terminal 236, a test data output (TDO) terminal 238, and a test mode select (TMS)/test clock terminals 240. TDI terminal 236, TDO terminal 238, and TMS/TCK terminals 240 are a four pin serial interface that is defined in IEEE standard 1149.1. TMS/TCK terminals 240 are coupled to each device in JTAG chain 200, notably, SPROM 250, JTAG device 252, and JTAG device 254. TMS/TCK terminals 240 provide control and clock signals to JTAG device chain 200 in a well-known manner. In general, TDO terminal 238 is coupled to the head of JTAG chain 200 and TDI terminal 236 is coupled to the tail JTAG chain 200. In the present example, TDO terminal 238 is coupled to SPROM 250 and TDI terminal 236 is coupled to JTAG device 254. In the JTAG chain 200, the TDO terminal of one device is coupled to the TDI terminal of an adjacent device. For example, the TDO terminal of SPROM 250 is coupled to the TDI terminal of JTAG device 252, and the TDO terminal of JTAG device 252 is coupled to the TDI terminal of the JTAG device 254.

In operation, micro-controller 202 executes one or more programs stored within firmware memory 208. Firmware memory 208 may be a non-volatile memory, such as a mask ROM. The programs stored within firmware memory 208 may be application independent in that the composition and length of JTAG device chain 200, as well as the location within the JTAG device chain 200 of SPROM 250, are unknown to microprocessor 220. The programs cause micro-controller 202 to communicate through master JTAG port 204 with SPROM 250 to effect a transfer of configuration data into configuration memory 116. Micro-controller 202 transmits instruction data through master JTAG port 204 via TDO terminal 238. Instruction data is serially propagated to each device in JTAG device chain 200. Micro-controller 202 receives data, notably configuration data from SPROM 250, through master JTAG port 204 via TDI terminal 236. Micro-controller 202 analyzes the configuration data and determines where in configuration memory 116 the configuration data should be stored.

Figure 3:
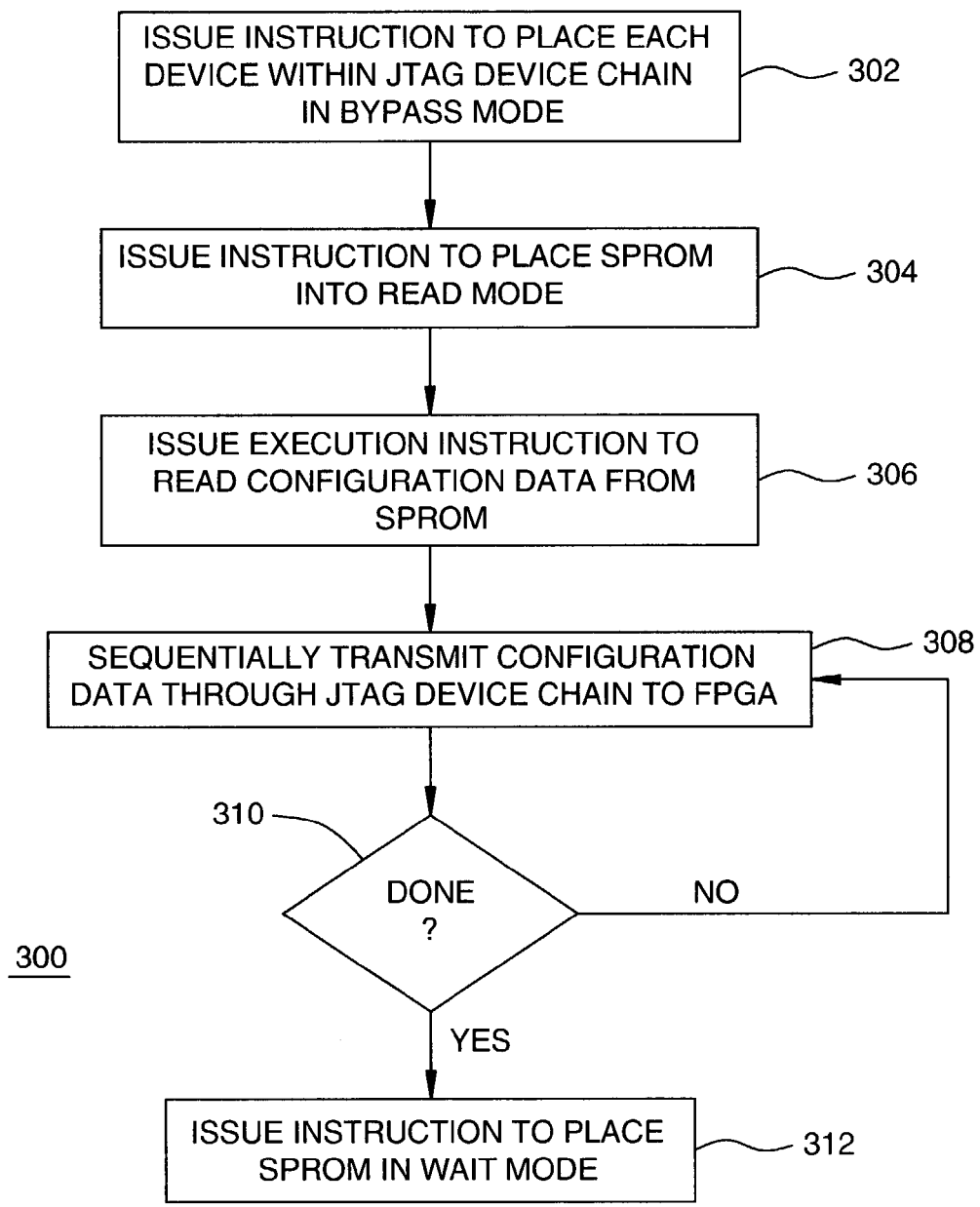
FIG. 3 depicts a flow diagram showing an exemplary FPGA configuration process in accordance with one or more aspects of the invention.

FIG. 3 depicts a flow diagram showing an exemplary FPGA configuration process 300 in accordance with one or more aspects of the invention. Process 300 may be understood with simultaneous reference to FIG. 2. Process 300 begins at 302, where micro-controller 202 issues an instruction to place each device in JTAG device chain 200 into bypass mode. In an embodiment, micro-controller 202 issues an instruction string comprising a series of ones long enough to place any reasonable number of devices in JTAG device chain 200 into the bypass mode. The instruction string is coupled to the head of JTAG device chain 200 (e.g., SPROM 250) via TDO terminal 238 and propagated to the tail of the JTAG device chain 200 (e.g., JTAG device 254). In an embodiment, a maximum number of devices in JTAG device chain 200 is prescribed to ensure that each device is placed into the bypass mode.

At 304, micro-controller 202 issues an instruction to place SPROM 250 into read mode. As described above, the programs stored within firmware memory 208 may be application independent, and thus the location of SPROM 250 within JTAG device chain 200 is unknown. In an embodiment, SPROM 250 is positioned closest to TDO terminal 238 (i.e., SPROM 250 is the head of JTAG device chain 200). The read instruction is thus transmitted to SPROM 250 via TDO terminal 238, while all other devices within JTAG device chain 200 remain in the bypass mode.

At 306, micro-controller 202 issues an execution instruction to read configuration data from SPROM 250. At 308, configuration data is sequentially transmitted through JTAG device chain 200 to TDI terminal 236 of master JTAG port 204. If the programs stored within firmware memory 208 are application independent, the latency of JTAG device chain 200 is unknown. In an embodiment, micro-controller 202 monitors the data stream coupled to TDI terminal 236 until a valid configuration header is detected. In an alternative embodiment, the latency of JTAG device chain 200 may be predicted by sending a first instruction string having a series of zeros long enough to propagate to each device in JTAG device chain 200. Then, a second instruction string having a series of ones is transmitted to JTAG device chain 200 until a first "one" is received at TDI terminal 236. The number of ones in the second instruction string is indicative of the length of JTAG device chain 200 and the expected read latency.

Within the configuration data coupled to TDI terminal 236, the configuration header contains information describing the amount of configuration data and where in configuration memory 116 the configuration data should be stored. If the configuration data is to be stored in multiple disjoint regions, the number of regions may be contained within the configuration header. If at 310 the configuration data is not completely loaded into configuration memory 116, process 300 returns to step 308. Otherwise, process 300 proceeds to step 312, where micro-controller 202 issues an instruction to cause SPROM 250 to exit the execution cycle and enter wait mode.

With renewed reference to FIG. 2, three ports are provided for communication between logic plane 105 and configuration plane 112. Configuration data port 228, command and status port 230, and expansion code space port 232 are each coupled to micro-controller 202 via interface 218. Configuration data port 228 allows for the transfer of additional configuration data into configuration memory 116. As described above, after microprocessor 220 is booted, microprocessor 220 may assume control of the configuration process. Micro-controller 202 continues to manage the writing of configuration memory 116 after microprocessor 220 is booted by receiving additional configuration data via configuration data port 228. Although the additional configuration data is shown as passing through micro-controller 202, the additional configuration data may bypass micro-controller 202 for increased speed. However, micro-controller 202 is still used for interpreting headers and generating addresses.

Thus, once microprocessor 220 has booted and assumed control of the configuration process, configuration of FPGA 100 may proceed using an application-specific configuration mechanism. For example, SPROM 250 may have a second address-and-data interface that connects to an external bus 256 of microprocessor 220. Alternatively, microprocessor 220 may obtain additional configuration data from anywhere within its memory hierarchy, such as an external memory (not shown) or BRAM 224. Microprocessor 220 may also import additional configuration data through MGT 222, for example, by connecting to the Internet.

Command and status port 230 allows microprocessor 220 to transmit commands to micro-controller 202 for execution. This allows microprocessor 220 to perform application-specific processes using JTAG device chain 200. The programs for these additional commands may be stored within BRAM 224, for example, and are accessible via expansion code space port 232. For example, microprocessor 220 may transmit diagnostic commands to micro-controller 202 to test devices using JTAG device chain 200. In another example, microprocessor 220 may command micro-controller 202 to retrieve additional configuration data from other addresses in SPROM 250 or from other devices in JTAG device chain 200. In particular, micro-controller 202 may update SPROM 250 using configuration data obtained by microprocessor 220 from an external source, such as the Internet.

Method and apparatus for configuring a programmable logic device using a master JTAG port has been described. A preferred embodiment of the invention utilizes a master JTAG port to load configuration data into a programmable logic device, such as an FPGA. By employing a master JTAG port, preferred embodiment of the invention does not require external configuration logic to drive the JTAG port during configuration. In addition, the master JTAG port provides a mechanism through which a microprocessor embedded within the FPGA can communicate with devices external to the FPGA. For example, a microprocessor can use the master JTAG port to perform system diagnostics or update configuration data stored within a non-volatile memory. Another embodiment of the invention may employ a relatively simple and inexpensive micro-controller to provide control of the master JTAG port.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. An apparatus for configuring a programmable logic device using configuration data stored in an external memory, the programmable logic device having a configuration memory, the apparatus comprising:
   a boundary scan port having a data input terminal and a data output terminal;
   an instruction-set processor having a first interface coupled to the boundary scan port and a second interface coupled to the configuration memory;
   wherein the data output terminal is coupled to provide instruction data to the external memory and the data input terminal is coupled to receive the configuration data from the external memory in response to the instruction data; and
   wherein the instruction-set processor is configured to provide the configuration data to the configuration memory.

2. The apparatus of claim 1, further comprising:
   internal memory coupled to the instruction-set processor and configured to store a program for providing the instruction data to the boundary scan port.

3. The apparatus of claim 1, wherein the instruction-set processor includes a third interface coupled to receive data from within the programmable logic device.

4. The apparatus of claim 3, wherein the third interface is coupled to receive additional configuration data.

5. The apparatus of claim 4, wherein the additional configuration data is provided by a microprocessor embedded within the programmable logic device.

6. The apparatus of claim 3, wherein the third interface is coupled to receive additional instruction data to be executed by the instruction-set processor.

7. The apparatus of claim 1, wherein the instruction-set processor includes a third interface coupled to communicate with a microprocessor embedded within the programmable logic device.

8. The apparatus of claim 1, wherein the boundary scan port is a Joint Test Action Group (JTAG) port.

9. The apparatus of claim 1, wherein the instruction-set processor is a micro-controller.

10. The apparatus of claim 1 further comprising:
    a microprocessor, wherein the configuration data provided by the instruction-set processor comprises data enabling the microprocessor to be booted to become operational.

11. The apparatus of claim 10, wherein after the microprocessor is booted, configuration data is further loaded and controlled using the microprocessor.

12. The apparatus of claim 11, the configuration data is loaded entirely by the instruction-set processor, even after the microprocessor is booted.

13. The apparatus of claim 10, wherein the apparatus is included with the programmable logic device in a single integrated circuit.

14. A system for configuring a programmable logic device having a configuration memory, comprising:
    an external memory located external to the programmable logic device, the external memory configured to store configuration data;
    a boundary scan port located within the programmable logic device, the boundary scan port having a data output terminal coupled to provide instruction data to the external memory and a data input terminal coupled to receive the configuration data from the external memory in response to the instruction data; and
    an instruction-set processor embedded within the programmable logic device, the instruction-set processor having a first interface coupled to the boundary scan port and a second interface coupled to the configuration memory, the instruction-set processor configured to provide the configuration data to the configuration memory.

15. The system of claim 14, further comprising:
    internal memory disposed within the programmable logic device, the internal memory coupled to the instruction-set processor, the internal memory configured to store a program for providing the instruction data to the boundary scan port.

16. The system of claim 14, wherein the instruction-set processor includes a third interface coupled to the programmable logic device.

17. The system of claim 16, wherein the third interface is coupled to receive additional configuration data from the internal memory.

18. The system of claim 17, wherein the additional configuration data is provided by a microprocessor embedded within the programmable logic device.

19. The system of claim 16, wherein the third interface is coupled to receive additional instruction data to be executed by the instruction-set processor.

20. The system of claim 14, wherein the instruction-set processor includes a third interface coupled to communicate with a microprocessor embedded within the programmable logic device.

21. The system of claim 14, wherein the boundary scan port is a Joint Test Action Group (JTAG) port.

22. A method for configuring a programmable logic device using configuration data stored in an external memory in a boundary scan device chain, the programmable logic device having a configuration memory, the method comprising:
    providing instruction data to the external memory through a boundary scan port of the programmable logic device;
    receiving the configuration data from the external memory through the boundary scan port in response to the instruction data; and
    providing the configuration data to the configuration memory.

23. The method of claim 22, wherein the step of providing instruction data comprises:
    sending an instruction string to the boundary scan device chain to place each device of the boundary scan device chain into a bypass mode;
    sending an instruction to the external memory to place the external memory into a read mode; and
    sending an execution instruction to the external memory for reading data from the external memory.

24. The method of claim 22, further comprising:
    determining latency of the boundary scan device chain.

25. The method of claim 22, further comprising:
    booting a microprocessor in the programmable logic device using the configuration data to enable the microprocessor to become operational.

26. The apparatus of claim 25, wherein the step of providing instruction data is performed by an instruction set processor until the microprocessor is booted, and after the microprocessor is booted the step of providing instruction data is performed by the microprocessor.

27. A method for configuring a programmable logic device, comprising:

providing a boundary scan device chain having an external memory;

providing a programmable logic device with a boundary scan port and configuration memory;

coupling the programmable logic device to the external memory of the boundary scan device chain through the boundary scan port;

loading the external memory with configuration data for the programmable logic device;

providing instruction data to the external memory through the boundary scan port of the programmable logic device;

receiving the configuration data from the external memory to the programmable logic device through the boundary scan port in response to the instruction data; and providing the configuration data to the configuration memory.

28. A system for configuring a programmable logic device, comprising:

a boundary scan device chain having an external memory;

the programmable logic device having a boundary scan port and configuration memory;

the programmable logic device coupled to the external memory of the boundary scan device chain through the boundary scan port, the programmable logic device operably arranged to:

provide instruction data to the external memory through the boundary scan port of the programmable logic device;

receive configuration data from the external memory to the programmable logic device through the boundary scan port in response to the instruction data; and store the configuration data in the configuration memory.

29. The system of claim 28, wherein the boundary scan port is a Joint Test Action Group (JTAG) port.

30. The system of claim 28, further comprising a micro-controller coupled between the boundary scan port and the configuration memory for transferring configuration data from the boundary scan port to the configuration memory.

31. The system of claim 28, further comprising a micro-controller coupled to the boundary scan port for communicating the instruction data to the external memory.

32. The system of claim 31, further comprising firmware coupled to the micro-controller, the firmware causing the instruction data to be communicated to the external memory.

33. An apparatus for configuring a programmable logic device using configuration data stored in external memory of a boundary scan device chain, the programmable logic device having configuration memory, the method comprising:

means for providing instruction data to the external memory through a boundary scan port of the programmable logic device;

means for receiving the configuration data from the external memory through the boundary scan port in response to the instruction data; and means for providing the configuration data to the configuration memory.

\* \* \* \* \*